United States Patent [19]
Ghio et al.

[11] Patent Number: 5,407,852
[45] Date of Patent: Apr. 18, 1995

[54] METHOD OF MAKING NOR-TYPE ROM WITH LDD CELLS

[75] Inventors: Emilio G. Ghio, Cambiago; Giuseppe Meroni, Agrate Brianza; Danilo Re, Bernareggio; Livio Baldi, Agrate Brianza, all of Italy

[73] Assignee: SGS-Thomson Microelectronics, S.r.l., Milan, Italy

[21] Appl. No.: 84,971

[22] Filed: Jun. 28, 1993

[30]    Foreign Application Priority Data

Jun. 26, 1992 [EP] European Pat. Off. ............ 92830337
Oct. 1, 1992 [EP] European Pat. Off. ............ 92830552

[51] Int. Cl.⁶ ............................................. H01L 21/70
[52] U.S. Cl. .......................................... 437/48; 437/44; 437/52
[58] Field of Search ............................. 437/44, 48, 52

[56]               References Cited
U.S. PATENT DOCUMENTS

| | | | |
|---|---|---|---|
| 4,208,780 | 7/1980 | Richman | 437/48 |
| 4,599,118 | 7/1986 | Ham et al. | 437/48 |
| 4,649,629 | 3/1987 | Miller et al. | 437/48 |
| 5,091,329 | 2/1992 | Bekkering et al. | 437/48 |

FOREIGN PATENT DOCUMENTS 0148448 4/1983 Japan .

OTHER PUBLICATIONS

Patent Abstracts of Japan, vol. 012, No. 287 (E-643) 5 Aug. 1988 & JP-A-63 064 361 (Sharp Corp) 22 Mar. 1988.
Patent Abstracts of Japan, vol. 9, No. 110 (E-314(1833) 15 May 1985 & JP-A-60 000 769 (Hitachi Seisakusho K. K.) 5 Jan. 1985.

*Primary Examiner*—Tom Thomas
*Attorney, Agent, or Firm*—Robert Groover

[57]              ABSTRACT

ROM memories made in MOS or CMOS technology with LDD cells may be programmed advantageously in a relatively advanced stage of fabrication by decoupling an already formed drain region from the channel region of cells to be permanently made nonconductive (programmed) by implanting a dopant in an amount sufficient to invert the type of conductivity in a portion of the drain region adjacent to the channel region. In CMOS processes, the programming mask may be a purposely modified mask commonly used for implanting source/drain regions of transistors of a certain type of conductivity. By using high-energy implantation and a dedicated mask, the programming may be effected at even later stages of the fabrication process.

36 Claims, 3 Drawing Sheets

METHOD OF MAKING NOR-TYPE ROM WITH LDD CELLS

CROSS-REFERENCE TO RELATED APPLICATION

This application claims priority from European Applications 92830337.9 (docket no. DB-790) and 92830552.3 (docket no. DB-821), filed Jun. 26, 1992 and Oct. 1, 1992, respectively, both of which are hereby incorporated by reference.

BACKGROUND AND SUMMARY OF THE INVENTION

The present invention relates to a process for fabricating and programming ROM type memory cells, made in MOS or CMOS technology with an LDD (a commonly used acronym of Lightly Doped Drain), source and/or drain graded diffusion. Programming is effected by making permanently nonconducting all the "programmed" cells of a ROM matrix having a common-source configuration (commonly known as a "NOR-type" ROM).

ROM memories are commonly used in microprocessor-based systems made in MOS or CMOS technology, and their programming with a certain content of information corresponding to the specific application takes place during the fabrication process of the integrated circuits containing ROM memory sections. For this reason, from a point of view of the management of customer's orders and production, it is advantageous to be able to program the ROM memories as late as possible in the device fabrication process. The single ROM memory cells are generally composed of an n-channel or a p-channel transistor, while ever more often the read circuitry of the memory cell matrix, as well as other circuits integrated on the same chip, are made in CMOS technology, for obvious reasons of reducing power consumption.

The programming of ROM memories by purposely modifying the mask used for defining the active areas of the cells which will exclude altogether the formation of a cell in certain preestablished locations of the matrix causing the formation of a thick field oxide layer in those locations instead of the formation of a thin gate oxide layer, remains a commonly used technique. However this approach requires programming to be effected in a relatively initial phase of the fabrication process of integrated circuits and therefore other methods of programming which may be carried out during later steps of the fabrication process are favored. According to another known approach, the programming of n-channel memory cells is effected by implanting boron through the apertures of dedicated programming mask in an amount sufficient to raise the threshold voltage of the cells of the matrix to be "programmed".

Another known solution consists in implanting boron exclusively in the source zone of the cells to be programmed, and by thereafter diffusing it under the gate structure. In this way, it is possible to increase the threshold voltage above the supply voltage without significantly lowering the breakdown voltage because the latter is influenced by the doping level of the channel near the drain junction of the cells. Nevertheless, also this process is not always satisfactory and in particular it is inapplicable to VLSI devices, having a common-source type of architecture of the ROM memory matrix.

According to a process described in a prior Italian Patent No. 1,217,372 of the same Applicant of the present application, which is hereby incorporated by reference, the programming of the cells of a ROM memory may be advantageously effected by the use of the same mask which is used for implanting source and drain junctions, by masking the source and/or drain areas adjacent to an already formed gate structure of the matrix's cells to be programmed, thus obtaining a decoupling between the gate and the source and drain regions, by virtue of the backing off of the latter from the respective gate structure.

All these known programming processes have been used primarily with memory cells having a standard structure, i.e. a structure which does not contemplate the formation of source and drain junctions with a graded diffusion profile obtained through two distinct steps of implantation carried out in self-alignment with the gate structure. (Typically, as mentioned above, such LDD structures are fabricated using a first relatively lighter implantation immediately after having defined the gate structures, and a second relatively heavier implantation after having formed so-called dielectric spacers along the sides of the gate structure; but this sequence can be varied.) On the other hand, memory cells with junctions having a graded diffusion profile ensure a better long term reliability and generally this technique is being widely used in high density integration processes for making highly reliable MOS transistors with improved electrical parameters, notably in the circuitry which is normally integrated region on the same chip together with a ROM memory matrix.

The present invention advantageously provides a fabrication and programming process for a ROM memory matrix with cells having junctions with a graded diffusion (LDD), which is remarkably simple to implement and which permits both n-channel and p-channel LDD-type transistors to be used in the ancillary and external circuitry without any requirement for additional masks.

Basically, the programming process of the invention consists of implanting an area defined by a noncritical mask and in a self-alignment condition in relation to the edge of a preformed gate structure, with a second dopant of a type suitable to produce in the semiconducting substrate a type of conductivity opposite to the one which is produced by a first dopant which is implanted on the same area when performing a first LDD implantation of the drain regions of all the cells. Such an implantation of said second dopant is performed in an amount sufficient to completely compensate and invert the type of conductivity produced by said first dopant in a portion of the drain region of the cell which is immediately adjacent to the gate structure of a cell to be programmed. Of course the attributes "first" and "second" of the dopants do not imply a specific order of implantation, and in fact the order may be inverted.

Normally, in the most common case of n-channel cells, a first n-type LDD implantation of the cells drain area, typically using phosphorus, is "compensated" and "inverted," in cells to be programmed by a programming (LDD) boron implantation also effected in self-alignment to the preformed gate structure, in a portion of the drain area of the cell close to the gate structure. According to a first embodiment of the invention, the programming implantation step (e.g. Boron implant)

may be performed before proceeding to form dielectric spacers on the sides of the gate structure and before performing a second (LDD) implantation carried out in self-alignment to the gate structure provided with lateral spacers, in the source area, with a dopant capable of enhancing an n-type conductivity, e.g. with phosphorus itself or more commonly with arsenic, while masking during this subsequent implantation the drain area of all the memory cells of the matrix by using a purposely modified (LDD) mask. In integrated circuits containing both n-channel and p-channel transistors, i.e. in a CMOS process, the programming mask used for the compensating-inverting boron implantation may conveniently be the same mask which is used for effecting a boron LDD implantation on drain and source areas of p-channel transistors of ancillary circuitry external to the memory matrix, actually modified in accordance with the data to be permanently recorded in the matrix of memory cells for the specific application.

The second step of implantation of the source and drain areas of the n-channel devices of the external circuitry with arsenic or phosphorus, in self-alignment with the gate structures provided with spacers, may then be effected by modifying the mask used for this purpose in the area occupied by the matrix of memory cells, so as to mask the drain areas of all the memory cells of the matrix. In view of the fact that the external reading circuitry, as well as other systems, integrated in the same memory device, commonly use CMOS structures (i.e. n-channel transistors as well as p-channel transistors), the fabrication process of the invention may be seen to be extremely advantageous by not requiring any additional process step. Of course, the same process of the invention may be used also for programming ROM memories with n-channel LDD cells in devices containing only n-channel LDD transistors. In this case, the repeated n-type dopant implantation would take place normally without using a mask and therefore it is necessary to use a dedicated programming mask for defining, within the areas of the matrix's cells to be programmed, a portion of the drain area defined by the mask wherein boron must be implanted in an amount sufficient to invert the type of conductivity which is produced in the semiconductor by an n-type dopant (typically phosphorus or arsenic) during a first LDD implantation step. Of course, the same process is valid also in case of channel ROM cells, by inverting the row of the dopants.

The process of the invention may also be implemented in an alternative form by effecting the programming implantation at a more advanced stage of the fabrication process of the devices, by using a high energy implantation process. In this case it is necessary to use a dedicated programming mask and a dedicated programming implantation step, however the additional cost is amply balanced by the great advantage of permitting the programming of the ROM memory matrix in a far more advanced step of the fabrication process of the integrated circuits. In practice, the programming implantation may be effected by implanting boron at high kinetic energy through the thickness of an intermediate dielectric isolation layer which is normally deposited after having completed the formation of the junctions in the semiconducting substrate and, desirably, after having "opened" the contacts and preferably before depositing the first metal layer.

The structure of the single memory cells of the invention has a source junction with a graded diffusion profile (LDD) while the drain junction has a configuration that comprises a drain region having a relatively light doping level, as obtained through a first LDD implantation and diffusion, because in the drain areas of the memory cells a subsequent implantation after having formed dielectric spacers on the sides of the gate structure is not performed. In practice the drain region of the memory cells retains a relatively low intrinsic doping level but this has been found not to modify in an appreciable way the electrical performances of the cells. This because of two factors, the first is due to the fact that the resistance of the lightly doped drain region is in any case substantially low in respect to the series resistance of the transistor, the second is due to the fact that by effecting a contact-area implantation and diffusion through the drain contact apertures before depositing the metal, the residual lateral extension of the low doping drain region is extremely small and therefore the ohmic drop through the drain region of the cells is in practice negligible.

BRIEF DESCRIPTION OF THE DRAWING

The present invention will be described with reference to the accompanying drawings, which show important sample embodiments of the invention and which are incorporated in the specification hereof by reference, wherein.

FIGS. from 1 to 6 are fragmentary schematic cross-section views illustrating the fabrication and programming process of the invention.

FIGS. from 9 to 14 are fragmentary schematic cross-section views which illustrate the fabrication and programming process of the invention, according to an alternative embodiment thereof.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The process of the invention will be described hereinafter by referring to the figures. The invention is described as embodied in a CMOS or MOS process, wherein the memory cells are n-channel transistors, realized in a semiconducting substrate region having a p-type conductivity. This option is commonly preferred because of the greater mobility of electrons as compared to holes.

Of course, what is herein described in relation to this preferred embodiment, is perfectly valid also in the case of an alternative embodiment wherein all the conductivities and the relative polarities are inverted.

Figure 7:
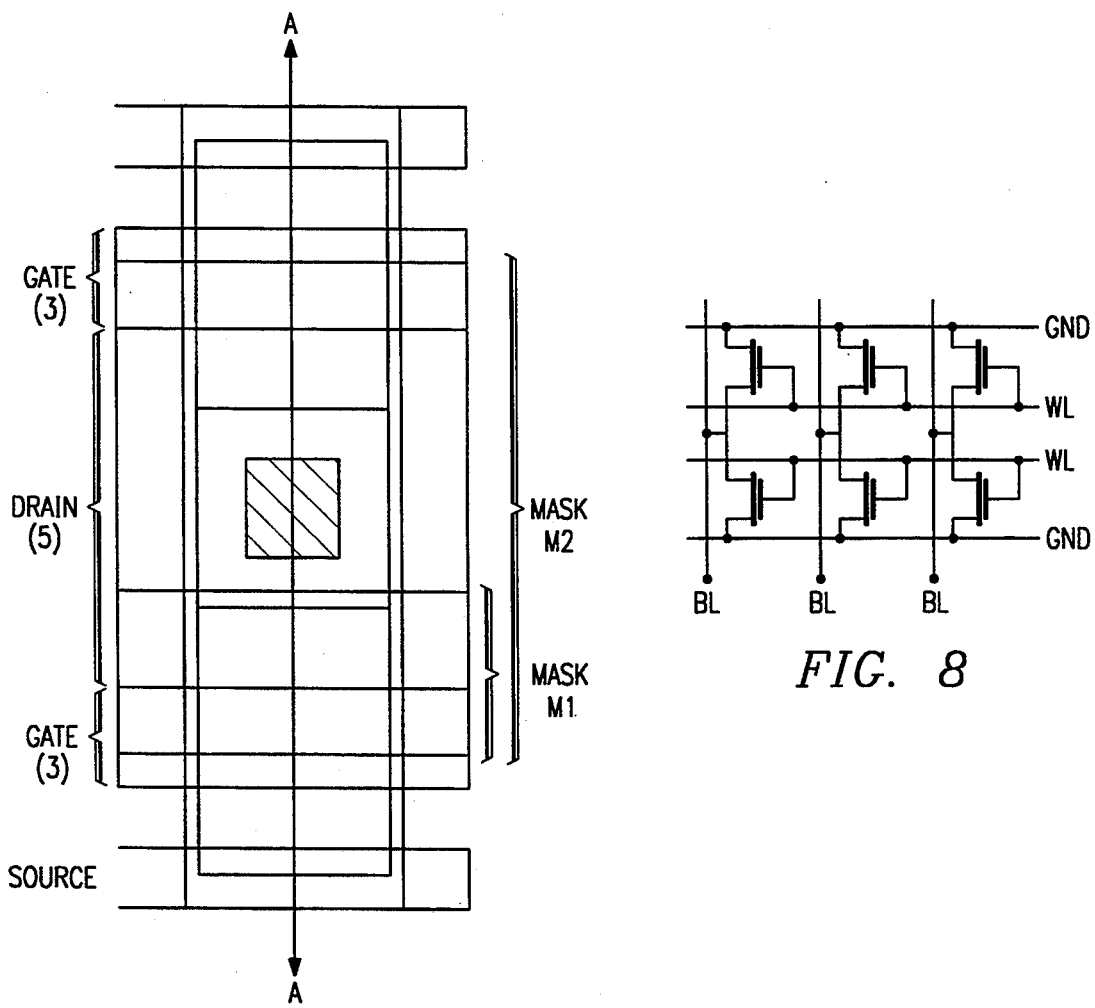
FIG. 7 is a schematic plan view of a cell made in accordance with the process of the invention.

The cross-section shown in the series of FIGS. 1 to 6 and 9 to 14 refer to a section plane A—A, identified in the plane view of FIG. 7, and they depict fabrication steps of a pair of side-to-side cells (i.e. having contiguous drain regions), belonging to a same column (bitline)

of the matrix and wherein the left side cell in the figure is assumed to be a "programmed cell".

Figure 1:
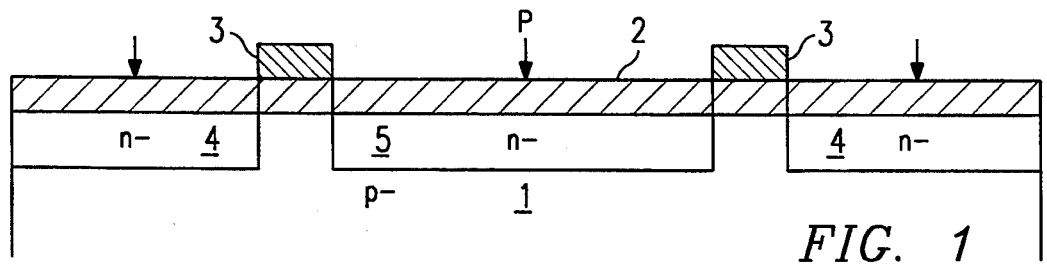

As shown in FIG. 1, the memory cells are formed in a semiconducting substrate region 1, having a p-type conductivity, following a standard sequence of operations of a normal CMOS or n-MOS fabrication process. This leads to the growth on the active areas of a gate oxide layer 2 and to the definition of a gate electrode 3 of the single cells, which is normally of doped polysilicon, patterned as a plurality of parallel strips, each constituting the gate of all the cells arranged in the same row of the matrix (row-lines or often "wordlines"). At this point of the fabrication process, on the whole front of the device, is the case of an n-MOS process, or in the active areas of n-channel transistors, as well as in all the active areas of the ROM memory matrix in the case of a CMOS process, a so-called LDD implantation of a dopant suitable to produce an n-type conductivity in the semiconductor region after diffusing the implanted dopant is carried out. The dopant may be arsenic or, more commonly, phosphorus. The implantation and the subsequent diffusion produces source and drain regions, 4 and 5, respectively, having a doping level which is purposely kept relatively low, separated from each other by a channel region having the same p-type conductivity of the substrate 1. The LDD phosphorus implantation is essentially carried out in self-alignment with predefined gate structures (or lines) 3. At least within the area occupied by the n-channel memory cell matrix, the phosphorus implantation is substantially a "blanket" (maskless) implantation performed on the active areas of all the cells.

Figure 2:
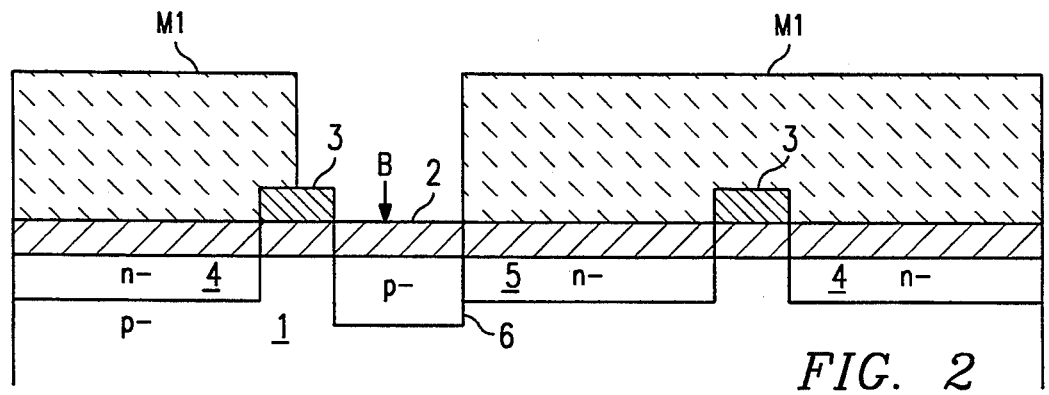
Figure 3:
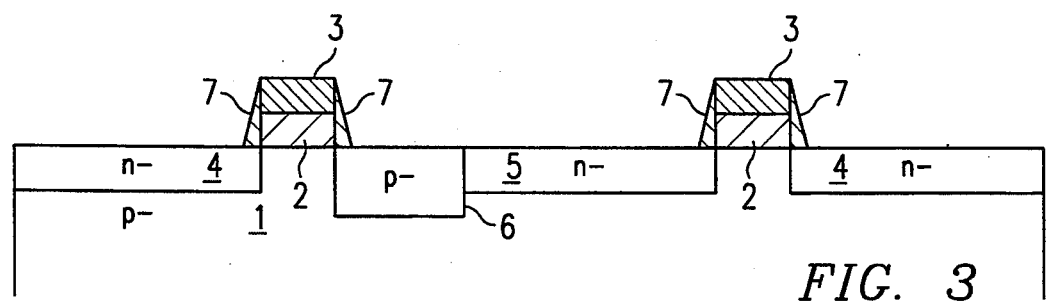

With reference to FIG. 2, by the use of a photoresist mask M1, a portion of the drain area of the cells to be programmed (e.g. the left-hand cell in the FIGS. 1-6), i.e. is to be made permanently nonconducting is defined. Essentially, the portion of the drain area defined by the programming mask M1 coincides with an area which is directly adjacent to the gate structure 3 of the cell to be programmed, i.e. with the portion of the drain region adjacent to the respective channel region. Through the openings of the mask M1, boron (or $BF_2$) is implanted in an amount sufficient to compensate the LDD implant of phosphorus, which, as mentioned above, is effected in a dose relatively low for realizing a graded dopant diffusion profile generally of source and drain junctions. This implant will eventually "invert" the type of conductivity in this region 6, which by assuming a p-type conductivity will constitute a separating region between the channel region and the drain region of a programmed matrix cell. Obviously, it is not strictly necessary to perform the two implantation steps of phosphorus and boron, described above in the order, as depicted in 1 and 2. As a matter of fact, the order may be inverted, and therefore it is possible to carry out a boron implantation first and subsequently a blanket LDD phosphorus implantation. After having so realized a substantial and permanent decoupling of the drain region 5 from the channel region directly underlying the gate structure 3 of the cells to be programmed (the left-hand cell in the series of FIGS. 1-6), the fabrication process may proceed through the steps for forming dielectric spacers 7 along the sides of the gate structure 3, notably by conformally depositing a layer of dielectric material (oxide) followed by etching under strongly anisotropic etch conditions.

At this point of the process the surface of the semiconducting substrate is reoxidized for forming again a dielectric gate layer 2'.

Figure 4:
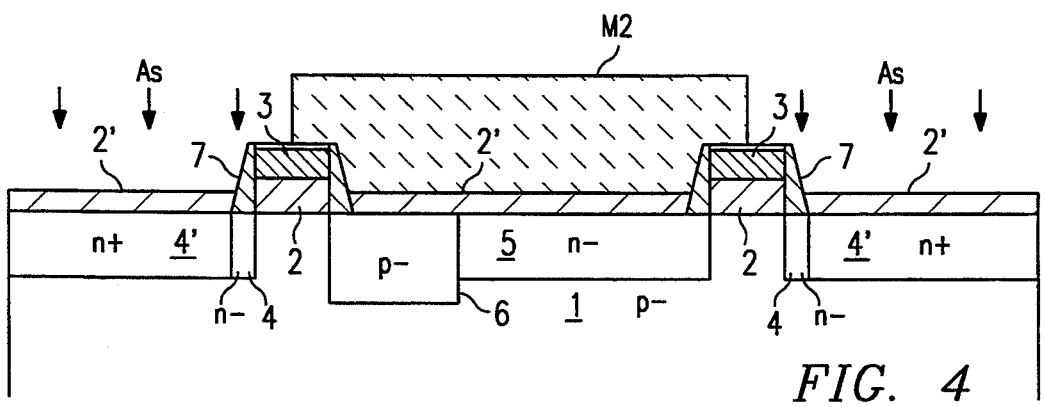
Figure 5:
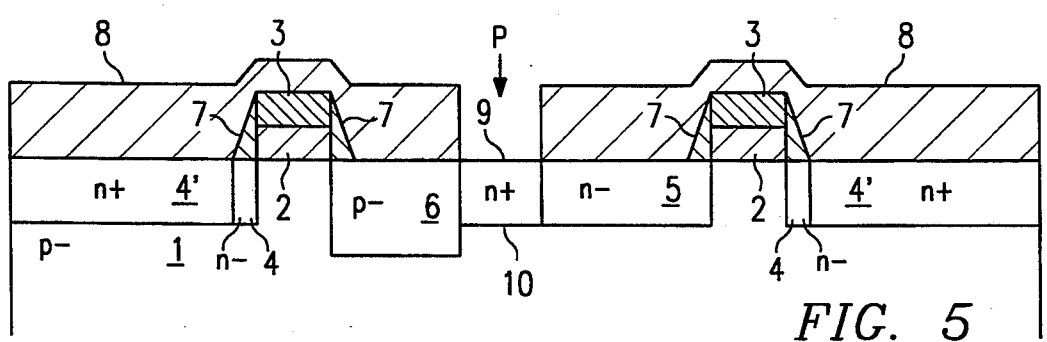
Figure 6:
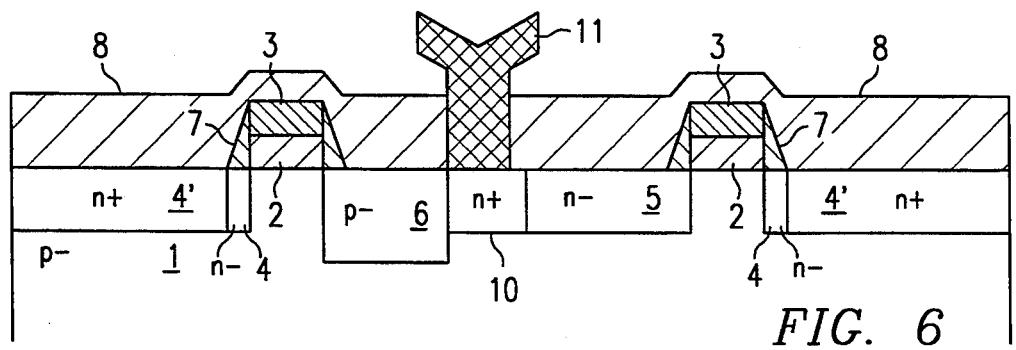

Thereafter, a "ROM protection" photoresist mask, M2, is formed, which, essentially within the area occupied by the memory cell matrix, masks the drain areas of all the memory cells, as depicted in the fragmentary cross-section of FIG. 4.

Figure 8:
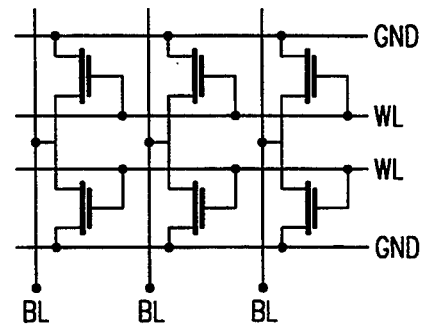
FIG. 8 is an electrical diagram showing the organization of the cells in a NOR-type ROM.

The mask M2 extends from a gate line to another, thus covering the contiguous drain areas of each pair of cells arranged along a same column (bitline) of the matrix. In a LDD-CMOS process this mask M2 may be the same mask which is used for implanting the source and drain areas of n-channel transistors with arsenic. Of course, this mask will need to be suitably redefined within the matrix's area. Through the openings of the mask M2, arsenic is implanted in self-alignment with the dielectric spacers 7 which have been formed on the sides of the gate lines, in order to form n+ source regions 4', which, according to the peculiar common-source architecture of the memory cell matrix, may coincide or comprise lines running parallel and alternately to each pair of gate lines 3 (row of lines), as shown in FIGS. 7 and 8 which illustrate the layout of the cells and the organization of the memory matrix respectively. The plurality of source lines may then be connected in common outside the matrix area.

The n+ implantation of the source areas, i.e. of the source lines reduces ohmic drops along the source lines of the matrix, beside determining the formation of source junctions having a graded diffusion profile.

The fabrication process may then proceed according to a standard sequence, with the deposition of an isolation dielectric layer 8, with the definition and openings of the drain contacts 9, which, as shown in FIGS. 7 and 8, establish an electrical contact with the contiguous drain regions of each pair of adjacent cells arranged along a same column of the matrix and a metal line (bitline).

The programming process of the invention lends itself to be implemented also in an alternative form, according to which, though remaining necessary dedicated programming masking and implanting steps also in the case of CMOS fabrication processes, permits to effect the programming in a far more advanced phase of the fabrication process of the integrated devices, in practice before depositing the first metal layer, with clear advantages in terms of facilitating fabrication and delivery time management.

This alternative embodiment of the 5process of the invention is schematically depicted in the series of FIGS. from 9 to 14, which depict the same situation already described in relation with the series of FIGS. from 1 to 6. With the purpose of underlining the choices between the two embodiments of the fabrication-programming process of the invention, in the series of FIGS. from 9 to 14 the same symbols and numbers are retained for identifying the same parts.

Figure 9:
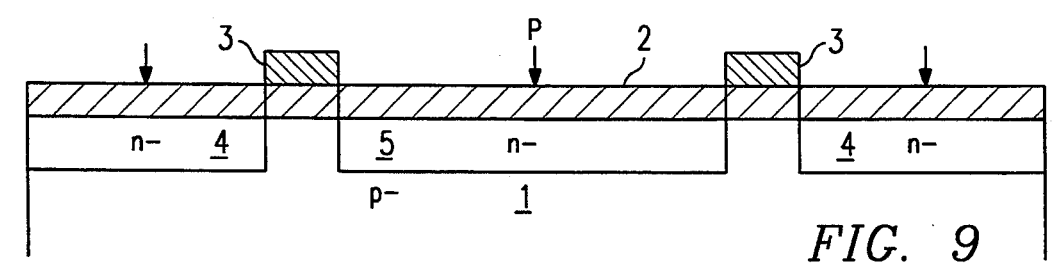
Figure 10:
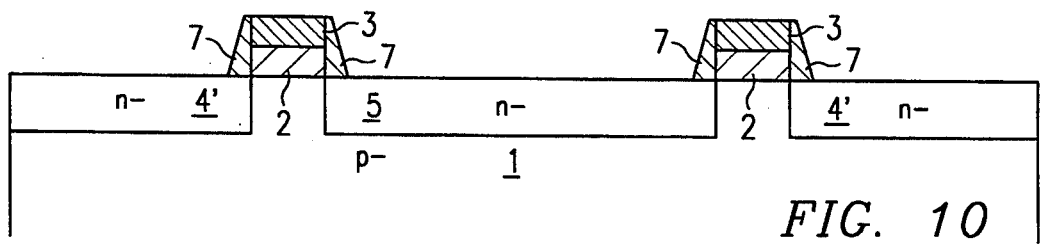
Figure 11:
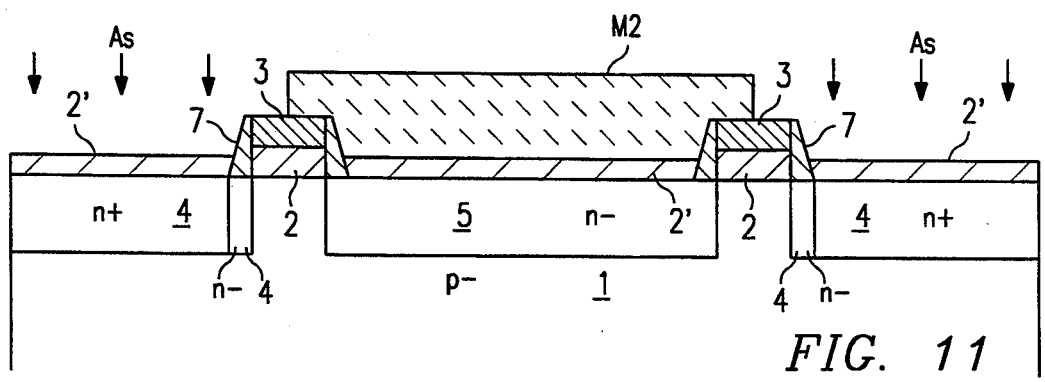

As depicted in FIGS. 9 and 10, after a first LDD implantation of the source and drain areas of all the matrix's cells, and after having removed the layer of gate oxide 2, dielectric spacers 7 are formed along the sides of the gate lines 3. As depicted in FIG. 11, after having reoxidized the drain and source areas of all the cells, thus forming again a gate oxide layer 2', the drain areas of all the memory cells are masked with a mask M2, which, as in the case of the process described hereinbefore, may be the same mask that is used for carrying out a second phosphorus implantation or more preferably an arsenic implantation in all the n-channel devices. Through this mask M2, the source areas of the matrix cells are implanted for forming the source regions 4' having a relatively heavy doping.

Figure 12:
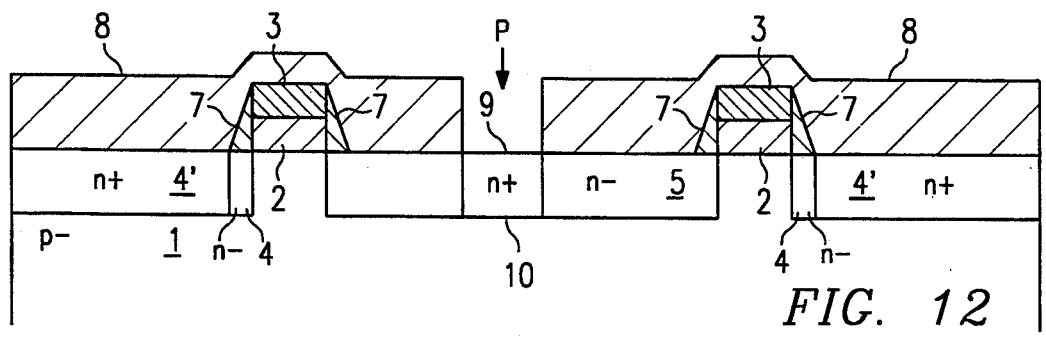

As shown in FIG. 12, the process proceeds with the deposition of an intermediate insulating dielectric layer 8, which may be subjected to a planarization process, according to known techniques.

The process may proceed through a standard sequence of fabrication steps with a masking and etching step for forming contact apertures through the intermediate dielectric layer 8, and in particular, within the ROM matrix, the drain contact apertures 9. Phosphorus or arsenic is implanted through the drain contact apertures 9 in a relatively heavy dose in order to form drain contact regions 10, having a relatively high (n+) doping level.

At this point, a programming mask M1 may be formed for defining, within the drain areas of the cells to be programmed (the left-hand cell in the series of figures) a portion of the drain region adjacent to the gate structure. Boron may be implanted through the openings of the mask M1 and through the thickness of the intermediate isolation layer 8, in the semiconducting substrate and thereafter diffused in order to form a separating region 6 having an inverted (p−) conductivity as compared to the (n−) conductivity which had been produced therein by the first LDD phosphorus implant. This programming boron implantation, carried out through the intermediate insulation layer 8, may be carried out by using implantation machines capable of accelerating boron ions up to a kinetic energy comprised between about 350–400 KeV. These energies may be obtained also using an implanting machine of normal type by effecting a "double" ionization of boron atoms. Moreover, it is possible to perform a programming boron implantation also after having deposited and patterned a first metal layer (11 in FIG. 14) employing in this case implanting machines capable of accelerating boron ions up to a kinetic energy in the order of MeV and therefore capable of passing through a first metal layer too. Alternatively, the first level metal layer 11 may be purposely patterned so as not to cover the areas through which a programming boron implantation could be eventually carried out for inverting the type of conductivity in an underlying drain separation zone in the cells to be permanently programmed. This last solution tends to complicate the layout of the cells and to determine a certain penalization in terms of occupied area.

The embodiment shown in the series of FIGS. from 1 to 6 and 9 to 14, represents a particular situation wherein the left-hand cell (looking at the drawings) is a programmed cell, i.e. permanently made nonconducting, while the right-hand cell represents a cell (i.e. a cell which is not permanently programmed). Therefore, during a reading phase of the operation of the memory in the embodiment shown, the drain contact 11 will conduct current pertaining to the right-hand cell only of the pair of cells depicted in the figures, because the left-hand cell is permanently made nonconducting by the P− separation region 6.

Before depositing the metallic filling material filling 11 in the drain contact hole, the semiconducting substrate under the contact area 9 should be suitably implanted, commonly with phosphorus, in order to form an n+ contact region 10, for the purpose of reducing contact resistance, i.e. forming a so-called ohmic contact, thus preventing that a contact be established with a region of the semiconductor having a relatively low doping level (n− or p−) which could produce a nonohmic contact characteristic (contact diode). This has also the effect of reducing the lateral extension of drain region of the right-hand cell (transistor) in the figures, i.e. of the conducting cells, and this contributes to make substantially negligible the intrinsic resistivity of the drain region of the cells, which, according to the present invention, retain a relatively light doping level, as determined just by only a first LDD implantation.

In the plan view of FIG. 7, the respective definition profiles of the features of the integrated structures are indicated. A functional electrical diagram of a matrix of memory cells each of which may be addressed through a series of bitlines BL, connecting together the drain contacts of the cells (in pairs) arranged along a same column and a series of wordlines WL, according to an architecture which is well known to a skilled technician, is shown. In practice, all the source lines, i.e. all the source regions of the memory cells of the matrix are interconnected in common and functionally constitute a ground node or a virtual ground node of the memory circuit.

The structure of the cells which is obtained by the process of the invention presents a source junction having a relatively heavy doping level while the drain junction retains a doping level relatively lighter than that of the source junctions, so as determined by the first LDD phosphorus implant only, in view of the fact that subsequently the formation of the spacers it is not implanted further. This fact does not sensibly degrade the electrical behavior of the cells. In fact, in a NOR-configured memory matrix, wherein all the drain areas of the cells are connected in parallel (to the relative metal bitline) and which therefore do not create high-impedance current paths, it is important that the source "node" which is common to all the matrix's cells, represent a reliable ground potential reference for the individual source junctions. Therefore, the relatively heavy doping of the source regions (i.e. of the junction region of the single cells and of the interconnecting lines) keeps to a minimum the impedance. On the other hand, the heavy contact region implantation which is carried out on the drain contact areas of the single cells, beside locally enriching of dopant a superficial layer of the semiconducting silicon substrate in order to reduce contact resistance, effectively reduces also the residual series resistance of the drain regions of the cells. In fact, at the end of the fabrication process in the nonprogrammed cells, the drain region which remains doped solely by the first LDD implantation has in fact a (residual) lateral extension which is considerably reduced by the formation of a zone having a relatively heavy doping level under the drain contact, in a central position in relation to the extension of the contiguous drain regions of each pair of cells.

In a sample specific implementation of the first class of embodiments, the following detailed process parameters have been used. However, it should be noted that these specific parameters are included only to provide the fullest possible disclosure, and do not by any means delimit the scope of any of the claimed inventions.

In this example, the background doping of region 1 (inside the p-tub regions) is 3 to $5 \cdot 10^{16} \, \text{cm}^{-3}$ P-type. The thickness of gate oxide 2 is 20 nm.

To form the LDD regions 5, 2 to $3 \cdot 10^{13}$ cm$^{-2}$ of phosphorus is implanted at 60 keV to produce a resulting junction depth of 0.2 to 0.25 μm.

The programming implant applies 5 to $8 \cdot 10^{13}$ cm$^{-2}$ of BF$_2$ at 60 keV. (Larger doses of this implant would be used if the larger doses of the LDD implant are used).

To form the n+ S/D regions 4, $5 \cdot 10^{15}$ cm$^{-2}$ of As is implanted at 60 keV, to produce a junction depth of 0.25 to 0.3 μm.

In this sample embodiment, with a cell size of 3.3×3.1 μm (or smaller), and a drawn width of 0.7 μm for the wordlines 3, the width of the openings in mask M1 is 1.3 to 1.5 μm, and the width of the oxide filaments 7 is 0.2 to 0.3 μm.

Figure 13:
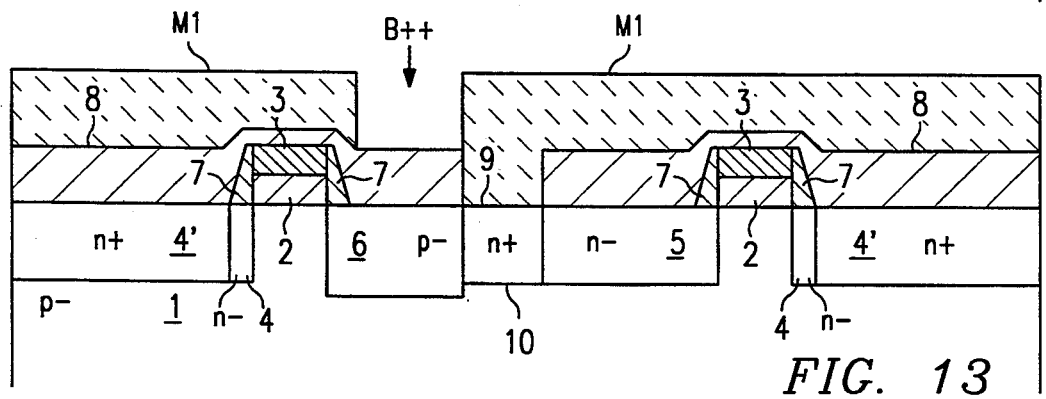
Figure 14:
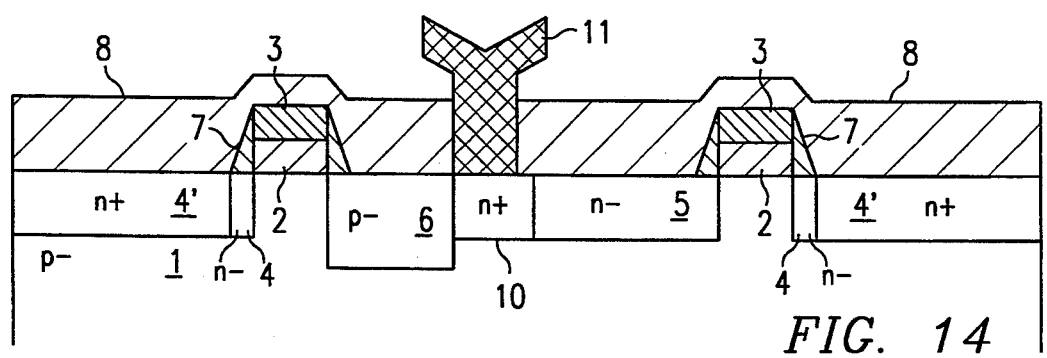

In the alternative embodiment of FIG. 13 etc., most of the steps are similar, except for the high-energy programming implant (which now is preferably performed at an energy of around 400 keV). The dose of the programming implant can be increased slightly (to reduce subthreshold leakage), but junction breakdown and oxide damage will limit this dose to about $10^{14}$ cm$^{-2}$. At least at these doses, it has been found that hardmasking is not necessary.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A method for programming a ROM memory cell formed in a semiconducting substrate of a first type of conductivity and comprising a source region and a drain region having a second conductivity type opposite to said first type of conductivity, separated by a channel region of said semiconducting substrate which is topped by a gate structure, said source region being separated from said channel by a lightly-doped region of said second conductivity type, comprising the steps of:
   selectively decoupling said drain region from said channel region by implanting and diffusing a dopant suitable to produce said first type of conductivity in a portion of said drain region adjacent to said channel region and wider than said lightly-doped region, in an amount sufficient to invert the type of conductivity in said portion of the drain region.

2. A fabrication method, comprising the steps of:
   (a.) providing a substrate which includes at least one substantially monolithic body of semiconductor material;
   (b.) forming insulated gate electrodes which are capacitively coupled, at locations of transistors, to at least some surface portions of said semiconductor body which have a first conductivity type; said gate electrodes being organized in regular stripes to define rows of said array of cell locations of transistors including a regular array of nonvolatile memory cell locations;
   (c.) implanting dopants of a second conductivity type, in an unpatterned self-aligned relation to said gate electrodes, to invert surface portions of said semiconductor body to said second conductivity type;
   (d.) implanting dopants of said first conductivity type, in a pattern corresponding to a pattern of data to be programmed into said memory cells, to again invert selected surface portions of said semiconductor body from said second conductivity type to said first conductivity type;
   (e.) forming dielectric spacers on one or more of said gate electrodes;
   (f.) after said step (e), performing a patterned shallow high-dose implant, with dopants of said second conductivity type, to form source diffusions in all of said memory cells;
   (g.) depositing an interlevel dielectric overall, and forming contact holes therein to expose a desired drain location of each said cell, and implanting dopant ions of said second conductivity type through said holes to form a drain diffusion, and making contact to said drain diffusions;
   whereby only the ones of said memory cells into which said implanting step (d) was not performed will form operable field-effect transistors.

3. The method of claim 2, wherein said step (d) is performed after said step (c).

4. The method of claim 2, wherein said monolithic body consists essentially of silicon.

5. The method of claim 2, wherein said sidewall filaments consist essentially of silicon dioxide.

6. The method of claim 2, wherein each said contact is an ohmic contact.

7. The method of claim 2, wherein said first conductivity type is P-type.

8. A fabrication method, comprising the steps of:
   (a.) providing a substrate which includes at least one substantially monolithic body of semiconductor material, including active area portions which are laterally isolated from each other and which are organized in regular stripes to define columns of a regular array of nonvolatile memory cell locations;
   (b.) forming insulated gate electrodes which are capacitively coupled, at locations of transistors, to at least some surface portions of said semiconductor body which have a first conductivity type; said gate electrodes being organized in regular stripes to define rows of said array of cell locations;
   (c.) implanting dopants of a second conductivity type, in an unpatterned self-aligned relation to said gate electrodes, to invert surface portions of said semiconductor body to said second conductivity type;
   (d.) implanting dopants of said first conductivity type, in a pattern corresponding to a pattern of data to be programmed into said memory cells, to again invert selected surface portions of said semiconductor body from said second conductivity type to said first conductivity type;
   (e.) forming dielectric spacers on one or more of said gate electrodes;
   (f.) after said step (e), performing a patterned shallow high-dose implant, with dopants of said second conductivity type, to form source diffusions in all of said memory cells; one or more of said source diffusions being shared by adjacent pairs of said memory cells;

(g.) depositing an interlevel dielectric overall, and forming contact holes therein to expose a desired drain location of each said cell, and implanting dopant ions of said second conductivity type through said holes to form a drain diffusion, and making contact to said drain diffusions; one or more of said drain diffusions being shared by adjacent pairs of said memory cells;

whereby only the ones of said memory cells into which said implanting step (d) was not performed will form operable field-effect transistors.

9. The method of claim 8, wherein said step (d) is performed after said step (c).

10. The method of claim 8, wherein said monolithic body consists essentially of silicon.

11. The method of claim 8, wherein said sidewall filaments consist essentially of silicon dioxide.

12. The method of claim 8, wherein each said contact is an ohmic contact.

13. The method of claim 8, wherein said first conductivity type is P-type.

14. A method, comprising the steps of:
(a.) providing a substrate which includes at least one substantially monolithic body of semiconductor material;
(b.) forming insulated gate electrodes which are capacitively coupled, at locations of transistors, to at least some surface portions of said semiconductor body which have a first conductivity type; said locations of transistors including a regular array of nonvolatile memory cell locations, and also including peripheral field-effect transistors of both first and second conductivity types;
(c.) implanting dopants of a second conductivity type, in an unpatterned self-aligned relation to said gate electrodes, to invert surface portions of said semiconductor body to said second conductivity type;
(d.) within said matrix, implanting dopants of said first conductivity type, in a pattern corresponding to a pattern of data to be programmed into said memory cells, to again invert selected surface portions of said semiconductor body from said second conductivity type to said first conductivity type;
(e.) forming dielectric spacers on one or more of said gate electrodes;
(f.) after said step (e), performing a patterned shallow high-dose implant, with dopants of said second conductivity type, to form source diffusions in all of said memory cells, and also form source and drain diffusions of said peripheral transistors of said second conductivity type;
(g.) depositing an interlevel dielectric overall, and forming contact holes therein to expose a desired drain location of each said cell and to expose contact locations of said peripheral transistors, and implanting dopant ions of said second conductivity type through said holes to form a drain diffusion, and making ohmic contact to said drain diffusions;

whereby, in said peripheral transistors of said second conductivity type, lightly-doped-drain extension regions formed by said step (c) remain below said dielectric spacers;

whereby only the ones of said memory cells into which said implanting step (d) was not performed will form operable field-effect transistors.

15. The method of claim 14, wherein said step (d) is performed after said step (c).

16. The method of claim 14, wherein said monolithic body consists essentially of silicon.

17. The method of claim 14, wherein said sidewall filaments consist essentially of silicon dioxide.

18. The method of claim 14, wherein each said contact is an ohmic contact.

19. The method of claim 14, wherein said first conductivity type is P-type.

20. A fabrication method, comprising the steps of:
(a.) providing a substrate which includes at least one substantially monolithic body of semiconductor material;
(b.) forming insulated gate electrodes which are capacitively coupled, at locations of transistors, to at least some surface portions of said semiconductor body which have a first conductivity type; said locations of transistors including a regular array of nonvolatile memory cell locations;
(c.) implanting dopants of a second conductivity type, in an unpatterned self-aligned relation to said gate electrodes, to invert surface portions of said semiconductor body to said second conductivity type;
(d.) forming dielectric spacers on one or more of said gate electrodes;
(e.) after said step (d), performing a patterned shallow high-dose implant, with dopants of said second conductivity type, to form source diffusions in said memory cells;
(f.) depositing an interlevel dielectric overall, and forming contact holes therein to expose a desired drain location of each said cell, and implanting dopant ions of said second conductivity type through said holes to form a drain diffusion, and making contact to said drain diffusions;
(g.) implanting dopants of said first conductivity type through said interlevel dielectric, in a pattern corresponding to a pattern of data to be programmed into said memory cells, to again invert selected surface portions of said semiconductor body from said second conductivity type to said first conductivity type;

whereby only the ones of said memory cells into which said implanting step (g.) was not performed will form operable field-effect transistors.

21. The method of claim 20, wherein said step (d) is performed after said step (c).

22. The method of claim 20, wherein said monolithic body consists essentially of silicon.

23. The method of claim 20, wherein said sidewall filaments consist essentially of silicon dioxide.

24. The method of claim 20, wherein each said contact is an ohmic contact.

25. The method of claim 20, wherein said first conductivity type is P-type.

26. A fabrication method, comprising the steps of:
(a.) providing a substrate which includes at least one substantially monolithic body of semiconductor material;
(b.) forming insulated gate electrodes which are capacitively coupled, at locations of transistors, to at least some surface portions of said semiconductor body which have a first conductivity type; said locations of transistors including a regular array of nonvolatile memory cell locations;

(c.) implanting dopants of a second conductivity type, in an unpatterned self-aligned relation to said gate electrodes, to invert surface portions of said semiconductor body to said second conductivity type;

(d.) performing a patterned shallow high-dose implant, with dopants of said second conductivity type, to form source diffusions in said memory cells;

(e.) depositing an interlevel dielectric overall, and forming contact holes therein to expose a desired drain location of each said cell, and implanting dopant ions of said second conductivity type through said holes to form a drain diffusion, and making contact to said drain diffusions;

(f.) implanting dopants of said first conductivity type through said interlevel dielectric, in a pattern corresponding to a pattern of data to be programmed into said memory cells, to again invert selected surface portions of said semiconductor body from said second conductivity type to said first conductivity type;

whereby only the ones of said memory cells into which said implanting step (f) was not performed will form operable field-effect transistors.

27. The method of claim 26, wherein said step (d) is performed after said step (c).

28. The method of claim 26, wherein said monolithic body consists essentially of silicon.

29. The method of claim 26, wherein said sidewall filaments consist essentially of silicon dioxide.

30. The method of claim 26, wherein each said contact is an ohmic contact.

31. The method of claim 26, wherein said first conductivity type is P-type.

32. A process for fabricating a ROM memory comprising a matrix of cells arranged in rows and columns, each having LDD source and drain regions separated by a channel region topped by a gate structure, in a semiconducting substrate, the process comprising the steps of forming said gate structure on a semiconducting substrate having a first type of conductivity, performing a first implantation, in self-alignment to said gate structure, of a dopant suitable to produce a conductivity of a type opposite to the type of conductivity of said substrate in said source and drain regions, forming dielectric spacers along the sides of said gate structure and performing a second implantation, in self-alignment with said gate structure provided with spacers, of a dopant suitable to increase the doping level in said regions, and also comprising the steps of a) defining with a first mask at least a portion adjacent to said gate structure of the drain area of a memory cell to be programmed by making it permanently nonconducting;

b) implanting through said mask a dopant suitable to produce a conductivity of the same type of the conductivity of said semiconducting substrate, in an amount sufficient to completely compensate and invert the effect of said first self-alignment implantation, at least in a portion adjacent to said gate structure of the drain region of the cell;

c) masking with a second mask the drain area of all the cells of the matrix;

d) implanting through said second mask said dopant suitable to increase the doping level in the source region of all the matrix's cells;

e) forming an isolating dielectric layer overall;

f) defining and opening through said dielectric layer apertures for contacting the drain region of each matrix's cell;

g) implanting a dopant suitable to increase the doping level in a region underlying the contact areas and forming drain contacts.

33. The process of claim 32, wherein said steps are carried out in the following order: c), d), e), f), g), a), b), and wherein said implantation which is performed in step b) is a high kinetic energy implantation.

34. A process as defined in claim 32, wherein said substrate has a p-type conductivity, said source and drain regions have an n-type conductivity obtained by implanting phosphorus in self-alignment with said gate structure; boron being implanted through said first mask in said part of drain area of the cells to be programmed and arsenic being implanted through said second mask in the source area of all the cells of said matrix.

35. A process as defined in claim 33, wherein said substrate has a p-type conductivity, said source and drain regions have an n-type conductivity obtained by implanting phosphorus in self-alignment with said gate structure; boron being implanted through said first mask in said part of drain area of the cells to be programmed and arsenic being implanted through said second mask in the source area of all the cells of said matrix.

36. A process according to claim 34, wherein said first phosphorus implantation and said second boron implantation are n− type and p+ type LDD implantations and said arsenic implantation is a source and drain junction implantation of n-channel devices of a standard LDD-CMOS fabrication process.

* * * * *